US009972725B2

(12) United States Patent
Hasegawa et al.

(10) Patent No.: US 9,972,725 B2
(45) Date of Patent: May 15, 2018

(54) SEMICONDUCTOR DEVICE AND MANUFACTURING METHOD OF THE SAME

(71) Applicant: TOYODA GOSEI CO., LTD., Kiyosu-shi (JP)

(72) Inventors: Kazuya Hasegawa, Kiyosu (JP); Tohru Oka, Kiyosu (JP); Nariaki Tanaka, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days. days.

(21) Appl. No.: 15/663,520

(22) Filed: Jul. 28, 2017

(65) Prior Publication Data
US 2018/0069135 A1 Mar. 8, 2018

(30) Foreign Application Priority Data

Sep. 2, 2016 (JP) ................. 2016-171343

(51) Int. Cl.
*H01L 29/66* (2006.01)
*H01L 29/872* (2006.01)
(Continued)

(52) U.S. Cl.
CPC ........ *H01L 29/872* (2013.01); *H01L 21/0274* (2013.01); *H01L 21/8252* (2013.01);
(Continued)

(58) Field of Classification Search
USPC .... 257/E29.338, E21.359, E21.41, E29.148, 257/E29.262, E29.091, 164, E21.403,
(Continued)

(56) References Cited

U.S. PATENT DOCUMENTS 5,686,753 A  11/1997 Miyata et al.
6,362,495 B1 * 3/2002 Schoen ............... H01L 29/1608
                                                                  257/471
(Continued)

FOREIGN PATENT DOCUMENTS

JP     H 08-139341 A    5/1996
JP     2015-023072 A    2/2015
(Continued)

*Primary Examiner* — Tram H Nguyen
(74) *Attorney, Agent, or Firm* — McGinn IP Law Group, PLLC

(57) ABSTRACT

There is provided a semiconductor device configured to include a plurality of semiconductor units formed in a semiconductor layer. Each of the semiconductor units comprises a mesa portion; a Schottky electrode formed on the mesa portion; an insulating film formed continuously on another portion of the Schottky electrode that is nearer to an edge of an upper face of the mesa portion than one portion of the Schottky electrode, on a side face of the mesa portion, and on a surface of the semiconductor layer other than the mesa portion; and a wiring electrode formed on the Schottky electrode and the insulating film. An angle between the side face of the mesa portion and the surface of the semiconductor layer is 90 degrees. A part of the wiring electrode is placed between the insulating films formed on opposed side faces of adjacent mesa portions. The insulating films formed on the opposed side faces are interconnected on the surface of the semiconductor layer, such as to separate the part of the wiring electrode from the semiconductor layer.

9 Claims, 7 Drawing Sheets

(51) Int. Cl.
*H01L 29/06* (2006.01)
*H01L 27/08* (2006.01)
*H01L 23/528* (2006.01)
*H01L 21/027* (2006.01)
*H01L 21/8252* (2006.01)
*H01L 29/20* (2006.01)
*H01L 29/45* (2006.01)

(52) U.S. Cl.
CPC ........ *H01L 23/528* (2013.01); *H01L 27/0814* (2013.01); *H01L 29/0657* (2013.01); *H01L 29/66212* (2013.01); *H01L 29/2003* (2013.01); *H01L 29/452* (2013.01)

(58) Field of Classification Search
USPC .......... 257/197, E21.425, E21.445, E27.015, 257/E27.06, E29.257, E29.271, 280, 473, 257/476; 438/237, 570, 127, 186
See application file for complete search history.

(56) References Cited

U.S. PATENT DOCUMENTS

| | | | |
|---|---|---|---|
| 2012/0018836 A1* | 1/2012 | Nagai | H01L 29/0619 257/471 |
| 2015/0021617 A1 | 1/2015 | Ueno et al. | |
| 2015/0295096 A1 | 10/2015 | Oka et al. | |
| 2016/0365421 A1 | 12/2016 | Hasegawa et al. | |

FOREIGN PATENT DOCUMENTS

| | | |
|---|---|---|
| JP | 2015-204331 A | 11/2015 |
| JP | 2015-204332 A | 11/2015 |
| JP | 2015-204333 A | 11/2015 |
| JP | 2015-204334 A | 11/2015 |
| JP | 2015-204335 A | 11/2015 |

\* cited by examiner

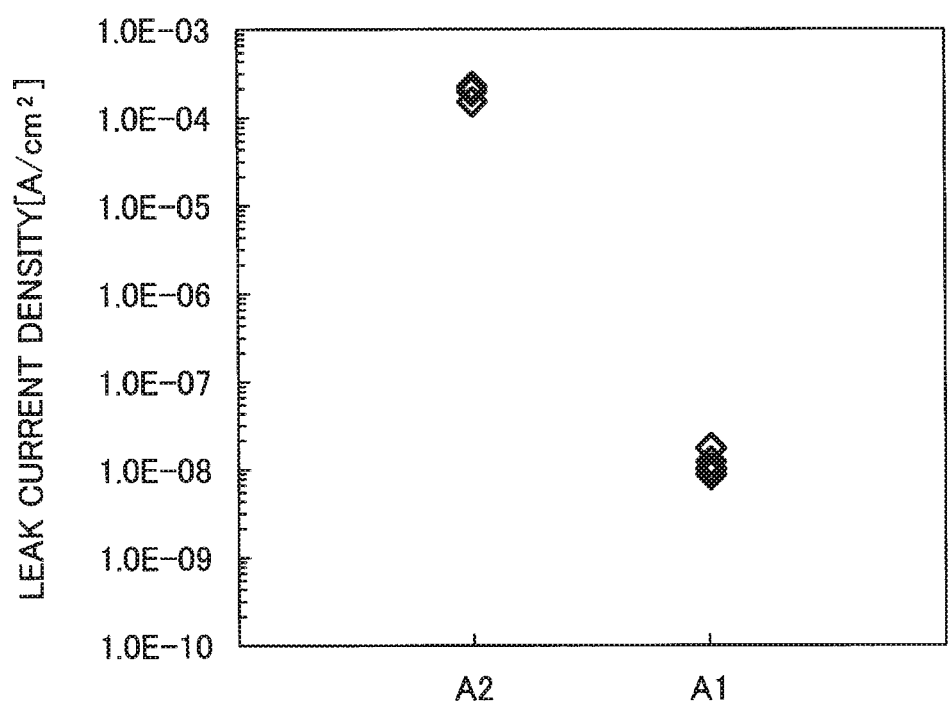

SEMICONDUCTOR DEVICE AND MANUFACTURING METHOD OF THE SAME

CROSS-REFERENCE TO RELATED APPLICATION

The present application claims priority from Japanese patent application 2016-171343 filed on Sep. 2, 2016, the entirety of the content of which is hereby incorporated by reference into this application.

BACKGROUND

Field

The disclosure relates to a semiconductor device and a manufacturing method of the same.

Related Art

With respect to a Schottky barrier diode (SBD) provided as one semiconductor device (semiconductor element), a proposed technique reduces the electric field crowding at an end of a Schottky contact and thereby suppresses leakage current at the reverse bias. Especially in a semiconductor device used as a power device, it is important to suppress the leakage current at the reverse bias by reducing the electric field crowding, in order to achieve a high blocking voltage.

In a Schottky barrier diode described in JP H08-139341A, an n-layer of a GaAs substrate is provided in a mesa form, and an insulating layer is formed on a foot region, an inclined region and a peripheral region of a top of the mesa form. An anode electrode is formed on a center region of the top of the n-layer of the GaAs substrate in the mesa form and on the insulating layer. In other words, the Schottky barrier diode described in JP H08-139341A includes a Schottky electrode having a field plate structure on a semiconductor layer having a mesa structure. In the Schottky barrier diode described in JP H08-139341A, the mesa structure of the semiconductor layer and the field plate structure of the Schottky electrode reduce the electric field crowding at an end of a Schottky contact between the semiconductor layer and the Schottky electrode.

The technique of JP H08-139341A reduces the Electric field intensity in the periphery of an end of the region of the Schottky contact, but fails to reduce the field intensity in a residual part of the region of the Schottky contact. In general, in the Schottky barrier diode, it is preferable to increase the area of the region of the Schottky contact with a view to reducing ON resistance. The technique of JP H08-139341A accordingly has a problem that increasing the area of the region of the Schottky contact with a view to reducing the ON resistance reduces the effect of suppressing the leakage current at the reverse bias.

In order to address at least part of the problems described above, the disclosure may be implemented by aspects or configurations described below.

SUMMARY

According to one aspect of the disclosure, there is provided a semiconductor device including a plurality of semiconductor units formed in a semiconductor layer. Each of the semiconductor units comprising: a mesa portion protruded upward in the semiconductor layer and configured to include an upper face and a side face; a Schottky electrode configured to form a Schottky contact with the semiconductor layer on the upper face of the mesa portion; an insulating film formed continuously on another portion of the Schottky electrode that is nearer to an edge of the upper face than one portion of the Schottky electrode on the upper face of the mesa portion, on the side face of the mesa portion, and on a surface of the semiconductor layer other than the mesa portion; and a wiring electrode formed on the Schottky electrode and the insulating film. An angle between the side face of the mesa portion and the surface of the semiconductor layer is not less than 85 degrees and not greater than 90 degrees. A part of the wiring electrode is placed between the insulating films formed on opposed side faces of adjacent mesa portions.

BRIEF DESCRIPTION OF DRAWINGS

FIG. 7 is a graph showing leak current densities under application of a reverse voltage with respect to samples A1 of the semiconductor device of the embodiment and samples A2 of the semiconductor device of the comparative example.

DESCRIPTION OF EMBODIMENTS

A. First Embodiment

A1. Configuration of Semiconductor Device

Figure 1:
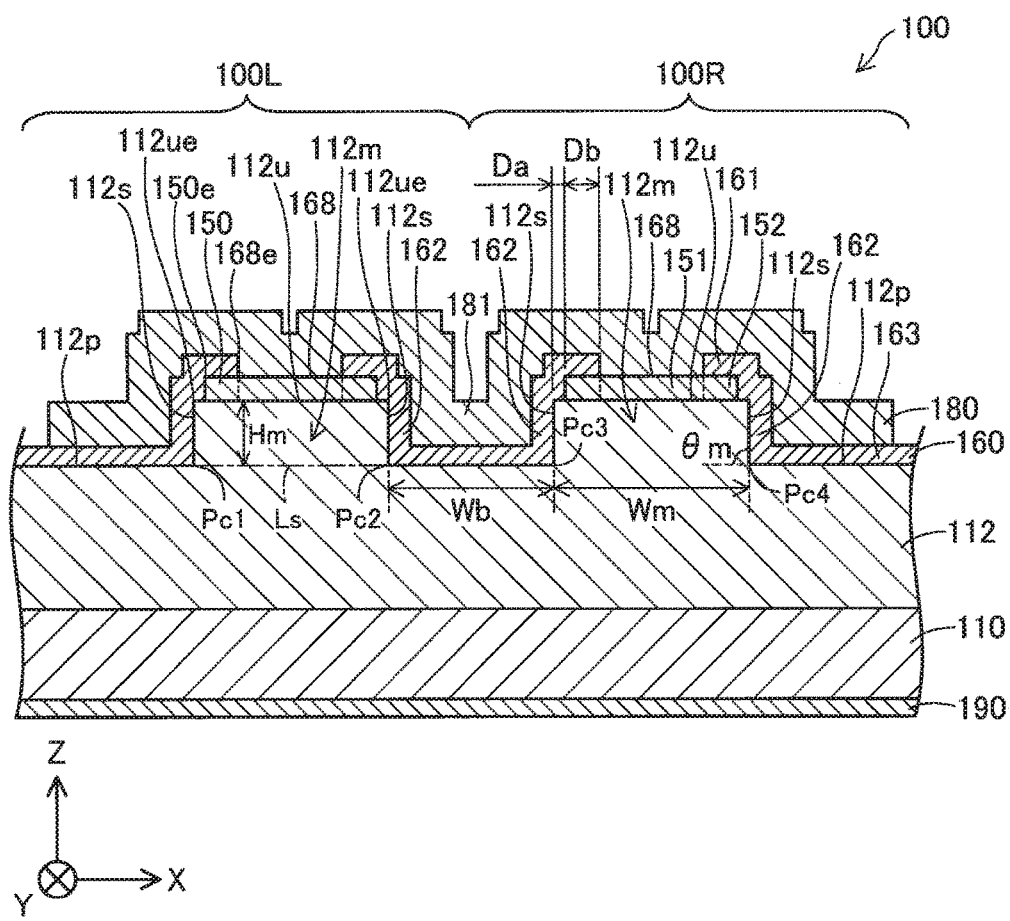
FIG. 1 is a sectional view schematically illustrating the configuration of a semiconductor device according to a first embodiment.

FIG. 1 is a sectional view schematically illustrating the configuration of a semiconductor device 100 according to a first embodiment. An X axis, a Y axis and a Z axis that are orthogonal to one another are illustrated in FIG. 1. The X axis is an axis extended from left to right in FIG. 1. The Y axis is an axis extended from front to back of the sheet surface in FIG. 1. The Z axis is an axis extended from bottom to top in FIG. 1. XYZ axes in other drawings correspond to the XYZ axes in FIG. 1. In the description hereof, a positive (+) direction of the Z axis may be called "upper" or "upward" for the purpose of convenience. The expression of "upper" or "upward" is, however, not intended to limit the arrangement (direction) of the semiconductor device 100. In other words, the semiconductor device 100 may be arranged in any direction.

The semiconductor device 100 is a GaN-based semiconductor device formed by using gallium nitride (GaN). The semiconductor device 100 is used for power control and is also called power device. The semiconductor device 100 has a predetermined profile in a predetermined region in the Y-axis direction. The configuration of the semiconductor device 100 is accordingly described with reference to FIG. 1 that is a sectional view taken on a cross section perpendicular to the Y axis.

The semiconductor device 100 is configured to include two vertical Schottky barrier diodes 100L and 100R. The Schottky barrier diodes 100L and 100R have an identical configuration. In the semiconductor device 100, the Schottky barrier diodes 100L and 100R share part of the configuration.

The semiconductor device 100 includes a substrate 110, a semiconductor layer 112, Schottky electrodes 150, an insulating film 160, a wiring electrode 180 and a cathode electrode 190.

The substrate 110 of the semiconductor device 100 is a plate-like semiconductor extended in both the X-axis direction and the Y-axis direction. According to this embodiment, the substrate 110 is mainly made of gallium nitride (GaN). In the description hereof, the expression of "mainly made of gallium nitride (GaN)" means containing gallium nitride (GaN) at 90% or higher molar fraction. The substrate 110 is an n-type semiconductor containing silicon (Si) as the donor element. The average value of silicon (Si) concentration included in the substrate 110 is $1 \times 10^{18}$ cm$^{-3}$.

The semiconductor layer 112 of the semiconductor device 100 is an n-type semiconductor layer that is located on a positive (+) side in the Z-axis direction of the substrate 110 and is extended in both the X-axis direction and the Y-axis direction. According to this embodiment, the semiconductor layer 112 is mainly made of gallium nitride (GaN). The semiconductor layer 112 contains silicon (Si) as the donor element. The average value of silicon (Si) concentration included in the semiconductor layer 112 is $1 \times 10^{16}$ cm$^{-3}$.

In the illustrated configuration of FIG. 1, the semiconductor layer 112 includes two mesa portions 112m, 112m and +Z-axis direction-side surfaces 112p located on the peripheries thereof. The mesa portion 112m of the semiconductor layer 112 is a structure of an approximately rectangular cross section protruded toward the positive (+) side in the Z-axis direction (upward) from the surface 112p. The mesa portions 112m form part of the semiconductor layer 112. The thickness (length in the Z-axis direction) of the semiconductor layer 112 is 10 μm (micrometer) at the mesa portions 112m.

The mesa portion 112m includes an upper face 112u and side faces 112s. An angle θm between the side face 112s of the mesa portion 112m and the surface 112p of the semiconductor layer 112 other than the mesa portion 112m is 90 degrees. The presence of such mesa portions 112m in the semiconductor device 100 suppresses the electric field crowding at an end 150e of the Schottky electrode 150. The angle θm is determined by measuring an angle between (i) a side face of the mesa portion and (ii) an extended plane of the surface of the semiconductor layer other than the mesa portion connecting with the side face of the mesa portion, at a position inside of the mesa portion, in a cross section that perpendicularly intersects with two side faces of the mesa portion that are provided across a predetermined interval and are arranged back to back (hereinafter called "reference cross section").

A height Hm of the mesa portion 112m shown in FIG. 1 is 3.0 μm. The "height of the mesa portion" means a distance, from a straight line Ls of interconnecting two points (Pc1 and Pc2 or Pc3 and Pc4 in FIG. 1) where the respective side faces of the mesa portion are connected with the surface of the semiconductor layer other than the mesa portion, to a farthermost point on the upper face of the mesa portion in the reference cross section. According to this embodiment, the upper face 112u of the mesa portion 112m is parallel to the surface 112p of the semiconductor layer 112 other than the mesa portion 112m, so that the height Hm is constant at the mesa portion 112m.

According to this embodiment, the height Hm of the mesa portion 112m is not less than 0.1 μm. This configuration provides the better effect of suppressing the electric field crowding at the end of the Schottky electrode 150 in the Schottky barrier diodes 100L and 100R of the semiconductor device 100, compared with a configuration that the height of the mesa portion is less than 0.1 μm. With a view to effectively reducing the field intensity, the height of the mesa portion is more preferably not less than 1.0 μm and is furthermore preferably not less than 2.0 μm. For a similar reason, it is preferable that the height Hm of the mesa portion 112m is greater than the thickness of the insulating film 160.

According to this embodiment, the height Hm of the mesa portion 112m is also not greater than 5.0 μm. This configuration facilitates processing of the mesa portion, compared with a configuration that the height of the mesa portion is greater than 5.0 μm. The height of the mesa portion may, however, be less than 0.1 μm or may be greater than 5.0 μm.

A width Wm of the mesa portion 112m shown in FIG. 1 is 6.0 μm. The "width of the mesa portion" means an interval between two points (Pc1 and Pc2 or Pc3 and Pc4 in FIG. 1) where the respective side faces of the mesa portion are connected with the surface of the semiconductor layer other than the mesa portion in the reference cross section.

According to this embodiment, the width Wm (6.0 μm) of the mesa portion 112m is not greater than 15.0 μm. As described later, the insulating film 160 and the wiring electrode 180 are arranged on the respective sides of the mesa portion 112m and the Schottky electrode 150. Apart 181 of the wiring electrode 180 is placed between the insulating films 160, 160 formed on the opposed side faces 112s, 112s of adjacent mesa portions 112m, 112m. This configuration narrows a region having no effect of the field plate structure, i.e., no effect of reducing the field intensity in the Schottky electrode 150, in the Schottky barrier diodes 100L and 100R of the semiconductor device 100. With a view to effectively reducing the field effect in an entire portion of Schottky contact, the width of the mesa portion is more preferably not greater than 10 μm and is furthermore preferably not greater than 6 μm.

According to this embodiment, the width Wm (6.0 μm) of the mesa portion 112m is not less than 2.0 μm. This configuration enables the mesa portion to be readily formed with high accuracy, compared with a configuration that the width of the mesa portion is less than 2.0 μm. The width of the mesa portion may, however, be less than 2.0 μm or may be greater than 15.0 μm.

A distance Wb between the mesa portions 112m, 112m shown in FIG. 1 is 3.0 μm. The "distance between the mesa portions" means a distance between two points (Pc2 and Pc3 in FIG. 1) where the opposed side faces of the adjacent mesa portions are respectively connected with the surface of the semiconductor layer other than the mesa portions.

According to this embodiment, the distance Wb (3.0 μm) between the adjacent mesa portions 112m, 112m is not greater than the width Wm (6.0 μm) of the mesa portion. This configuration increases the number of Schottky barrier diodes 100L and 100R arranged per unit area, compared with a configuration that the distance between the adjacent mesa portions is greater than the width of the mesa portion.

As a result, this configuration reduces the overall ON resistance of the semiconductor device 100.

According to this embodiment, the distance Wb (3.0 μm) between the adjacent mesa portions 112m, 112m is not less than 1.0 μm. This configuration enables a part of the wiring electrode 180 (this part of the wiring electrode 180 is shown by a reference sign 181) to be readily provided adjacent to the insulating films 160, 160 (these portions of the insulating film 160 are shown by reference sign 162, 162) between the adjacent mesa portions 112m, 112m (as shown in a center area of FIG. 1), compared with a configuration that the distance between the adjacent mesa portions is less than 1.0 μm.

The distance between the adjacent mesa portions may, however, be greater than the width of the mesa portion or may be less than 1.0 μm.

The Schottky electrode 150 shown in FIG. 1 is an anode electrode made of an electrically conductive material. The Schottky electrode 150 forms a Schottky contact with the semiconductor layer 112 on the upper surface 112u of the mesa portion 112m.

In terms of reducing the field intensity of the Schottky electrode 150, a distance Da between the end 150e of the Schottky electrode 150 and an edge 112ue of the upper face 112u of the mesa portion 112m is preferably not greater than 2.0 μm. The distance between the end of the Schottky electrode and the edge of the upper face of the mesa portion denotes a distance in the X-axis direction between the end of the Schottky electrode and the edge of the upper face of the mesa portion in the reference cross section. The distance between the end of the Schottky electrode and the edge of the upper face of the mesa portion may, however, be greater than 2.0 μm.

According to this embodiment, the Schottky electrode 150 has a layered structure of a layer of 100 nm (nanometer) in thickness mainly made of nickel (Ni) and a layer of 100 nm in thickness mainly made of palladium (Pd), which are arranged sequentially from the semiconductor layer 112-side. Nickel (Ni) of the Schottky electrode 150 serves to form a Schottky contact with gallium nitride (GaN) of the semiconductor layer 112. Palladium (Pd) of the Schottky electrode 150 serves to enhance the Schottky barrier height.

The insulating film 160 of the semiconductor device 100 shown in FIG. 1 is an insulating film formed continuously on a portion 152 of the Schottky electrode 150 on the upper face 112u of the mesa portion 112m, on the side face 112s of the mesa portion 112m, and on the surface 112p of the semiconductor layer 112 other than the mesa portion 112m. The insulating film 160 is not formed on a portion 151 of the Schottky electrode 150 on the upper face 112u of the mesa portion 112m (as shown by an opening 168 in FIG. 1). The portion 152 of the Schottky electrode 150 where the insulating film 160 is formed is located nearer to each edge 112ue of the upper face 112u of the mesa portion 112m than the portion 151 of the Schottky electrode 150 where the insulating film 160 is not formed.

The insulating film portions 162, 162 formed on the opposed side faces 112s, 112s of the adjacent mesa portions 112m, 112m are interconnected on the surface 112p surrounding the mesa portions 112m of the semiconductor layer 112, such as to separate the part 181 of the wiring electrode 180 from the semiconductor layer 112 (as shown in the center area of FIG. 1).

The insulating film 160 has electrical insulation properties. According to this embodiment, the insulating film 160 has a layered structure of a layer of 100 nm in thickness mainly made of aluminum oxide ($Al_2O_3$) and a layer of 500 nm in thickness mainly made of silicon dioxide ($SiO_2$).

In terms of suppressing breakdown of the insulating film 160, the thickness of the insulating film 160 is preferably not less than 50 nm, is more preferably not less than 100 nm and is furthermore preferably not less than 200 nm. The thickness of the insulating film 160 may, however, be less than 50 nm. In order to form the part 181 of the wiring electrode 180 between the mesa portions 112m, 112m, the thickness of the insulating film 160 is preferably less than half the distance Wb between the mesa portions 112m, 112m.

The insulating film 160 has openings 168 on the Schottky electrodes 150. The opening 168 is formed by removing part of the insulating film 160 that is formed as described above to expose the Schottky electrode 150 by wet etching. A distance Db in the X-axis direction between the end 150e of the Schottky electrode 150 and an edge 168e of the opening 168 is not less than the distance Da in the X-axis direction between the end 150e of the Schottky electrode 150 and the edge 112ue of the upper face 112u of the mesa portion 112m.

In terms of ensuring the adhesiveness between the Schottky electrode 150 and the insulating film 160, the distance Db is preferably not less than 1 time the distance Da, is more preferably not less than 1.5 times the distance Da and is furthermore preferably not less than 2 times the distance Da. With a view to reducing an increase in the ON resistance caused by reduction of the contact area between the Schottky electrode 150 and the wiring electrode 180, the distance Db is preferably not greater than 20-times the distance Da.

The wiring electrode 180 of the semiconductor device 100 shown in FIG. 1 is an anode electrode that is electrically connected with the Schottky electrodes 150 inside of the openings 168. The wiring electrode 180 is formed continuously on the portions 151 of the Schottky electrodes 150 placed inside of the openings 168, on portions 161 of the insulating film 160 that are formed on the other portions 152 of the Schottky electrodes 150 placed outside of the openings 168, on the portions 162 of the insulating film 160 that are formed on the respective side faces 112s of the mesa portions 112m, and on portions 163 of the insulating film 160 that are formed on the surfaces 112p surrounding the mesa portions 112m of the semiconductor layer 112. The part 181 of the wiring electrode 180 is placed between the insulating films 160, 160 (162, 162) formed on the opposed side faces 112s, 112s of the adjacent mesa portions 112m, 112m.

The wiring electrode 180 is made of an electrically conductive material. The wiring electrode 180 has a field plate structure in which the insulating film 160 (162, 163) is placed between the semiconductor layer 112 and the wiring electrode 180. When a reverse voltage is applied to the wiring electrode 180, a depletion layer is spread from the wiring electrode 180- and the insulating film 160 (162, 163)-side into the semiconductor layer 112. As a result, this provides a high blocking voltage in the semiconductor device 100.

According to this embodiment, the wiring electrode 180 has a layered structure of a layer of 35 nm in thickness mainly made of titanium nitride (TiN) and a layer of 1000 nm in thickness mainly made of an aluminum silicon alloy (AlSi), which are arranged sequentially from the Schottky electrode 150- and the insulating film 160-side. Titanium nitride (TiN) of the wiring electrode 180 serves as a barrier metal to prevent mutual diffusion of the electrode materials between the electrodes. The aluminum silicon alloy (AlSi)

of the wiring electrode 180 serves to control an electrical resistance in the wiring electrode 180.

The cathode electrode 190 of the semiconductor device 100 shown in FIG. 1 is an ohmic electrode that forms an ohmic contact on a negative (−) side in the Z-axis direction of the substrate 110. The cathode electrode 190 is made of an electrically conductive material. The cathode electrode 190 has a layered structure of a layer mainly made of titanium (Ti) and a layer mainly made of an aluminum silicon alloy (AlSi).

Each of the Schottky barrier diodes 100L and 100R is a semiconductor unit (shown in FIG. 1) configured to include the substrate 110, the semiconductor layer 112, the Schottky electrode 150, the insulating film 160, the wiring electrode 180 and the cathode electrode 190 described above. Each of the Schottky barrier diodes 100L and 100R is configured such that the insulating film 160 and the wiring electrode 180 are provided on the respective sides of the portion 151 of the Schottky electrode 150. In the semiconductor device 100, the Schottky barrier diodes 100L and 100R are configured to share the substrate 110, the semiconductor layer 112, part of the insulating film 160, the wiring electrode 180 and the cathode electrode 190. The wiring electrode 180 is provided across the respective Schottky electrodes 150 and the insulating film 160 of the Schottky barrier diodes 100L and 100R.

The semiconductor device 100 according to the embodiment may be referred to as a "semiconductor device". The semiconductor layer 112 may be referred to as a "semiconductor layer". The Schottky barrier diodes 100L and 100R correspond to a "semiconductor unit". The upper face 112u may be referred to as an "upper face". The side face 112s may be referred to as a "side face".

The portion 151 of the Schottky electrode 150 according to the embodiment may be referred to as "one portion of the Schottky electrode on the upper face of the mesa portion". The portion 152 of the Schottky electrode 150 may be referred to as "another portion of the Schottky electrode that is nearer to an edge of the upper face than one portion of the Schottky electrode on the upper face". The surface 112p of the semiconductor layer 112 may be referred to as a "surface of the semiconductor layer other than the mesa portion".

The portion 161 of the insulating film 160 according to the embodiment may be referred to as a "portion of the insulating film formed on the another portion of the Schottky electrode". The portion 162 of the insulating film 160 may be referred to as "portion of the insulating film formed on the side face of the mesa portion". The portion 163 of the insulating film 160 may be referred to as "part of a portion of the insulating film formed on the surface of the semiconductor layer".

The angle θm according to the embodiment may be referred to as an "angle between the side face of the mesa portion and the surface of the semiconductor layer". The part 181 of the wiring electrode 180 may be referred to as a "part of the wiring electrode".

A2. Manufacturing Method of Semiconductor Device

Figure 2:
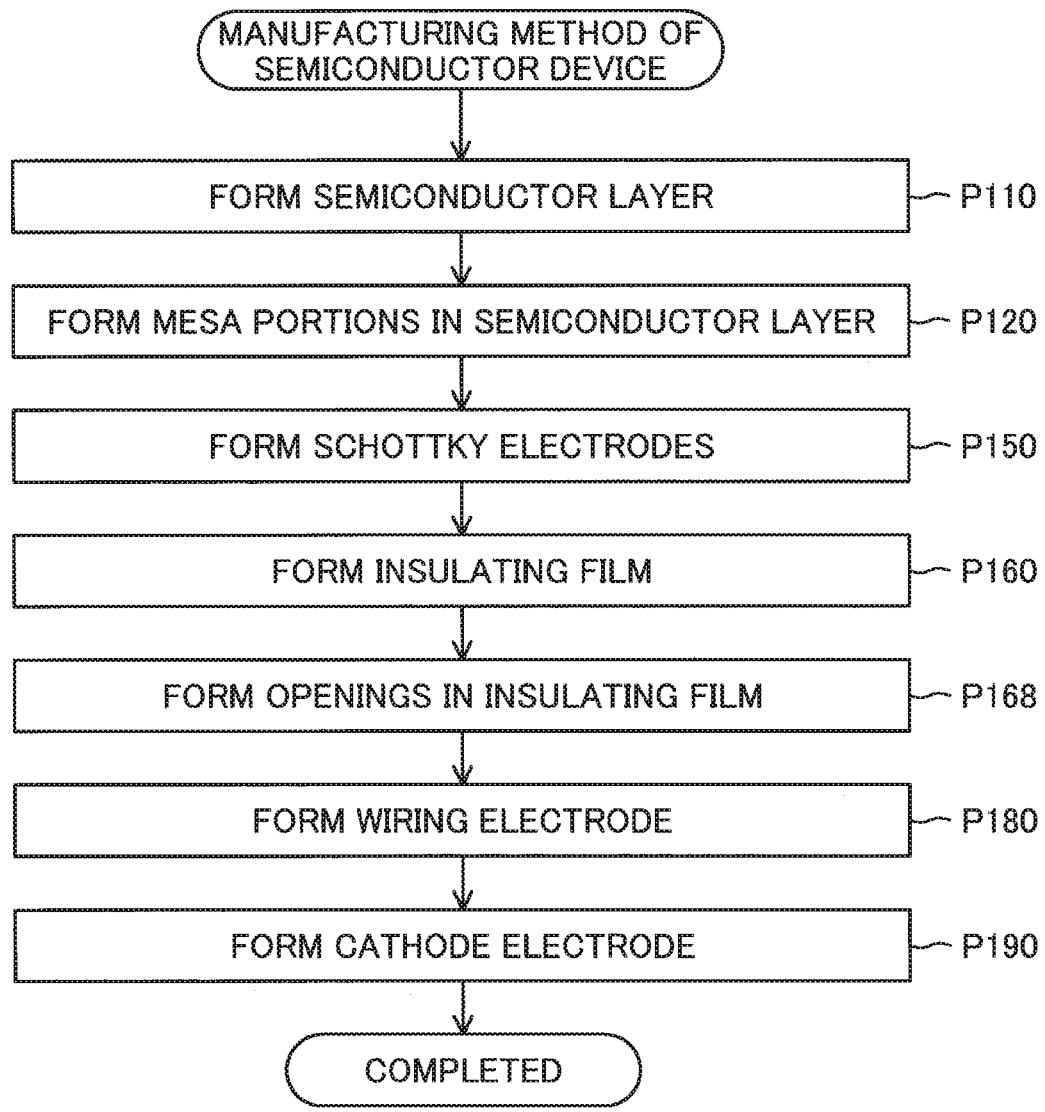
FIG. 2 is a process chart showing a manufacturing method of the semiconductor device according to the first embodiment.

FIG. 2 is a process chart showing a manufacturing method of the semiconductor device 100 according to the first embodiment. At process P110, the manufacturer of the semiconductor device 100 forms the semiconductor layer 112 on the substrate 110 by epitaxial growth. According to this embodiment, the manufacturer forms the semiconductor layer 112 by epitaxial growth using an MOCVD apparatus that employs the technique of metal organic chemical vapor deposition (MOCVD).

At process P120, the manufacturer forms the mesa portions 112m, 112m (shown in FIG. 1) in the semiconductor layer 112. According to this embodiment, the manufacturer first causes silicon dioxide ($SiO_2$) to deposit on the semiconductor layer 112 by plasma chemical vapor deposition. The manufacturer subsequently performs patterning of the layer of silicon dioxide using a photoresist and removes the layer of silicon dioxide other than parts covered by the photoresist by CF-based dry etching. The manufacturer then removes parts of the semiconductor layer 112 by chlorine (Cl)-based dry etching using the partly remaining layer of silicon dioxide as an etching mask. The manufacturer subsequently removes the etching mask of silicon dioxide. As a result, the parts masked by the layer of silicon dioxide form the mesa portions 112m 112m, and the removed parts of the semiconductor layer 112 form the surfaces 112p of the semiconductor layer 112 other than the mesa portions 112m, 112m (shown in FIG. 1).

At process P120, the angle θm between the side face 112s of each of the mesa portions 112m, 112m and the surface 112p of the semiconductor layer 112 adjacent to the mesa portion 112m is set to 90 degrees (as shown in FIG. 1) by appropriately controlling the etching gas and the applied voltage. For example, a procedure of increasing the applied voltage achieves anisotropic etching in a more ideal manner. A procedure of appropriately regulating the components of the etching gas and controlling the applied voltage achieves a good balance between removal of the semiconductor layer by etching and generation of products by the etching reaction.

At process P150 in FIG. 2, the manufacturer forms the Schottky electrodes 150 (shown in FIG. 1) on the upper faces 112u, 112u of the respective mesa portions 112m, 112m. According to the embodiment, the manufacturer forms the Schottky electrodes 150 by a lift off method using a photoresist.

More specifically, the manufacturer first applies a resist on the entire surface of the semiconductor layer 112. The manufacturer subsequently masks parts of the upper faces 112u, 112u of the mesa portions 112m, 112m where the Schottky electrodes 150, 150 are to be formed and irradiates the resist with light for exposure. The manufacturer subsequently develops and washes the resist such as to remove the non-exposed parts covered by the mask. Accordingly a mask is formed on the semiconductor layer 112 other than the parts where the Schottky electrodes 150, 150 are to be formed on the upper faces 112u, 112u of the mesa portions 112m, 112m. No mask is formed, on the other hand, on the parts where the Schottky electrodes 150, 150 are to be formed on the upper faces 112u, 112u of the mesa portions 112m, 112m.

The manufacturer then sequentially forms films of a layer of 100 nm in thickness made of nickel (Ni) and a layer of 100 nm in thickness made of palladium (Pd) from the semiconductor layer 112-side by electron beam vapor deposition. The manufacturer subsequently removes the mask pattern from the semiconductor layer 112. As a result, the Schottky electrodes 150, 150 are formed on the upper faces 112u, 112u of the mesa portions 112m, 112m (as shown in FIG. 1).

According to the embodiment, the angle θm between the side face 112s of the mesa portion 112m formed at process P120 and the surface 112p of the semiconductor layer 112 is not less than 85 degrees and not greater than 90 degrees (more specifically, is equal to 90 degrees). In the photolithography of process P150 to form the Schottky electrode 150 on the upper face 112u of the mesa portion 112m, there is little possibility that light enters from the side face 112s of the mesa portion 112m into the semiconductor layer 112 during exposure and is reflected or refracted such as to expose the resist on the upper face 112u of the mesa portion 112m through its rear face. This configuration accordingly enables the Schottky electrodes 150, 150 of high profile accuracy to be formed even when the mesa portion 112m is set to have the small width Wm. This will be described later in detail.

At process P160 in FIG. 2, the manufacturer forms the insulating film 160 (shown in FIG. 1). According to the embodiment, the manufacturer forms a layer mainly made of aluminum oxide ($Al_2O_3$) by atomic layer deposition (ALD) and subsequently forms a layer mainly made of silicon dioxide ($SiO_2$) on the layer of aluminum oxide by plasma chemical vapor deposition (plasma CVD). As a result, the insulating film 160 is formed on the semiconductor layer 112 and on the Schottky electrodes 150. The insulating film 160 is formed at process P160 such that the insulating films 160, 160 formed on the opposed side faces 112s, 112s of the adjacent mesa portions 112m, 112m are interconnected on the surface 112p of the semiconductor layer 112 (as shown in FIG. 1).

At process P168 in FIG. 2, the manufacturer forms the openings 168 on which the Schottky electrodes 150 are exposed (as shown in FIG. 1) in the insulating film 160. According to the embodiment, the manufacturer forms a mask pattern using a photoresist on the surface of the insulating film 160 other than parts to be removed as the openings 168 and removes the parts of the insulating film 160 by fluoric acid-based wet etching. As a result, the openings 168 are formed in the unmasked parts of the insulating film 160. The manufacturer subsequently removes the mask pattern formed on the insulating film 160.

As a result, the insulating film 160 is formed continuously (i) on another portion 152 of the Schottky electrode 150 on the upper face 112u that is located nearer to each edge 112ue of the upper faces 112u than one portion 151 of the Schottky electrode 150 (shown in FIG. 1), (ii) on the side face 112s of the mesa portion 112m and (iii) on the surface 112p of the semiconductor layer 112 other than the mesa portion 112m. The insulating film 160 is not formed on the portion 151 of the Schottky electrode 150 on the upper face 112u of the mesa portion 112m (as shown by the opening 168 in FIG. 1).

At process P180 in FIG. 2, the manufacturer forms the wiring electrode 180 (shown in FIG. 1). According to the embodiment, the manufacturer first forms an electrode layer that is to serve as the wiring electrode 180, over the Schottky electrodes 150 and the insulating film 160 by sputtering. More specifically, the manufacturer forms a layer of 35 nm in thickness made of titanium nitride (TiN) on the Schottky electrodes 150 and the insulating film 160 and subsequently forms a layer of 1000 nm in thickness made of an aluminum silicon alloy (AlSi) on the layer of titanium nitride.

The manufacturer subsequently performs patterning of the formed electrode layer by using a photoresist and removes the electrode layer other than parts covered by the photoresist by chlorine (Cl)-based dry etching. The photoresist covers the parts of the electrode layer placed on (i) the portions 151 of the Schottky electrodes 150 placed inside of the openings 168; (ii) the portions 161 of the insulating film 160 formed on the other portions 152 of the Schottky electrodes 150; (iii) the portions 162 of the insulating film 160 formed on the respective side faces 112s of the mesa portions 112m; and (iv) the portions 163 of the insulating film 160 formed on the surfaces 112p of the semiconductor layer 112. As a result, the wiring electrode 180 is formed (as shown in FIG. 1). The manufacturer then removes the mask pattern formed on the wiring electrode 180.

As a result of process P180, the wiring electrode 180 is formed continuously on the portions 151 of the Schottky electrodes 150 placed inside of the openings 168, on the portions 161 of the insulating film 160 formed on the other portions 152 of the Schottky electrodes 150, on the portions 162 of the insulating film 160 formed on the respective side faces 112s of the mesa portions 112m, and on the portions 163 of the insulating film 160 formed on the surfaces 112p of the semiconductor layer 112 (as shown in FIG. 1).

As a result of formation of the wiring electrode 180 at process P180, the part 181 of the wiring electrode 180 is placed between the insulating films 160, 160 formed on the opposed side faces 112s, 112s of the adjacent mesa portions 112m, 112m. The part 181 of the wiring electrode 180 is accordingly formed on the insulating film 160 that is connected on the semiconductor layer 112.

At process P190 in FIG. 2, the manufacturer forms the cathode electrode 190. According to the embodiment, the manufacturer sequentially forms a layer mainly made of titanium (Ti) and a layer mainly made of an aluminum silicon alloy (AlSi) to be placed on the layer of titanium by sputtering, such as to form the cathode electrode 190.

The semiconductor device 100 (shown in FIG. 1) is completed through this series of processes.

Process P120 according to the embodiment may be referred to as "process (a)". Process P150 may be referred to as "process (b)". Process P160 may be referred to as "process (c)". Process P180 may be referred to as "process (d)".

A3. Advantageous Effects in Photolithography Process

Figure 3:
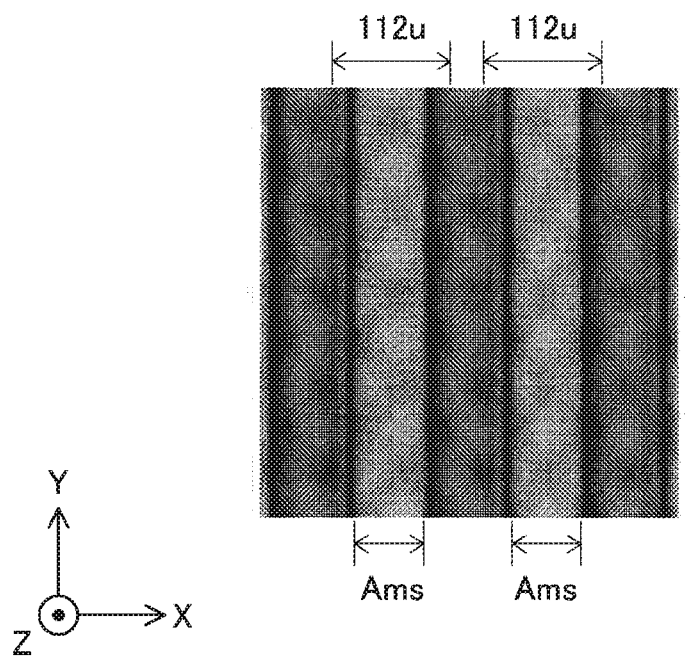
FIG. 3 is a photograph showing the state of a photoresist after exposure of the resist and removal of non-exposed parts covered by the mask at process P150 of FIG. 2 in the manufacturing process of the semiconductor device.

FIG. 3 is a photograph showing the state of a photoresist after exposure of the resist and removal of non-exposed parts covered by the mask at process P150 of FIG. 2 in the manufacturing process of the semiconductor device 100. In FIG. 3, areas Ams denote areas masked during exposure. The areas Ams masked during exposure are areas in which the Schottky electrodes 150 (shown in FIG. 1) are to be formed. FIG. 3 also shows the upper faces 112u of the mesa portions 112m (shown in FIG. 1).

Figure 4:
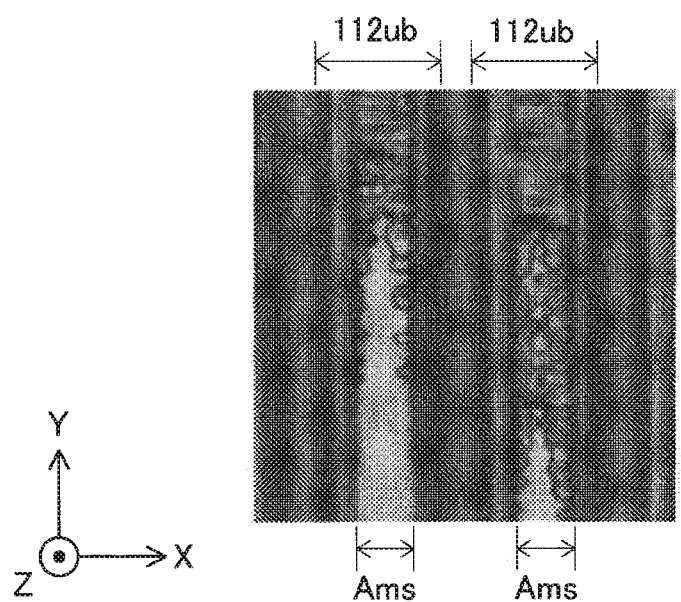
FIG. 4 is a photograph showing the state of a photoresist after exposure of the resist and removal of non-exposed parts covered by the mask at a process corresponding to process P150 of FIG. 2 in a manufacturing process of a semiconductor device of a comparative example.
Figure 5:
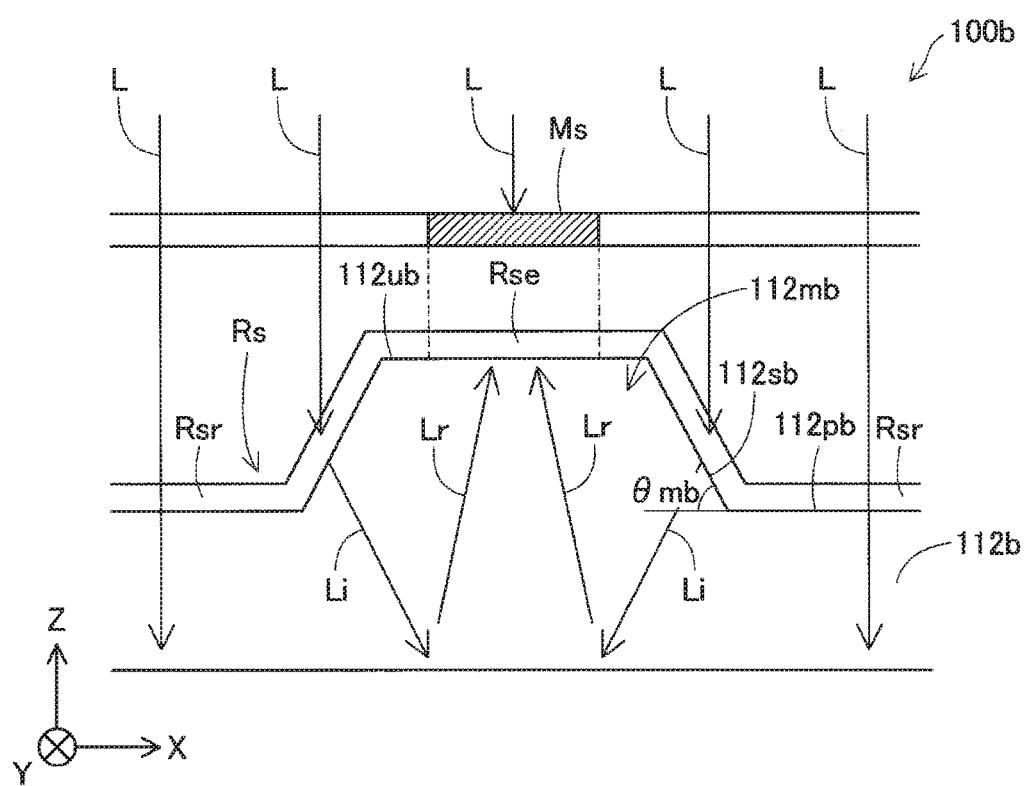
FIG. 5 is a diagram illustrating the process corresponding to process P150 of FIG. 2 in the manufacturing process of the semiconductor device of the comparative example.

FIG. 4 is a photograph showing the state of a photoresist after exposure of the resist and removal of non-exposed parts covered by the mask at a process corresponding to process P150 of FIG. 2 in a manufacturing process of a semiconductor device 100b of a comparative example. The semiconductor device 100b of the comparative example has a similar configuration to that of the semiconductor device 100 of the above embodiment except that an angle θmb between a side face 112sb of a mesa portion 112mb and a surface 112pb of a semiconductor layer 112b is 70 degrees (as shown in FIG. 5). The manufacturing process of the semiconductor device 100b of the comparative example is similar to the manufacturing process of the semiconductor device 100 shown in FIG. 2 except that the parameters at process P120 are adjusted to provide the angle θmb of 70 degrees.

As shown in FIG. 4, in the manufacturing process of the semiconductor device 100b of the comparative example, some parts of the resist in the areas Ams masked during exposure are not removed but remain on the semiconductor layer 112b. As shown in FIG. 3, on the other hand, in the manufacturing process of the semiconductor device 100 of the embodiment, the resist is substantially fully removed in the areas Ams masked during exposure. A phenomenon described below is expected to occur in the manufacturing process of the semiconductor device 100b of the comparative example.

FIG. 5 is a diagram illustrating the process corresponding to process P150 of FIG. 2 in the manufacturing process of the semiconductor device 100b of the comparative example. The respective components of the semiconductor device 100b shown in FIG. 5 are expressed by reference signs with addition of a suffix "b" to the reference signs provided to express the corresponding components of the semiconductor device 100. In FIG. 5, only one mesa portion 112mb is shown for ease of technical understanding.

A resist Rs is applied on an upper face 112ub and side faces 112sb of the mesa portion 112mb and a surface 112pb of a semiconductor layer 112b surrounding the mesa portion 112mb. Only a part Rse where the Schottky electrode 150 is to be formed on the upper face 112ub of the mesa portion 112mb is shielded from light by a mask Ms, while other parts Rsr are irradiated with light L emitting downward.

The parts Rsr of the resist Rs are irradiated with light to be exposed. The part Rse shielded from the light L by the mask Ms is, on the other hand, supposed to be not exposed. The light L that is not shielded by the mask Ms is, however, likely to enter from the inclined side faces 112sb of the mesa portion 112mb into the semiconductor layer 112b and to be refracted and reflected in the semiconductor layer 112b (as shown by arrows Li and Lr), such as to expose the part Rse of the resist Rs through inside of the semiconductor layer 112b. This may be the reason why some of the resist parts Rse in the masked areas Ams are not removed but remain on the semiconductor layer 112b in the semiconductor device 100b of the comparative example as shown in FIG. 4.

This problem arises when the semiconductor layer 112b is a wide band gap semiconductor that allows for transmission of light. Reduction of the dimensions of the part Rse shielded from the light L by the mask Ms, in other words, reduction of the dimensions of the area in which the Schottky electrode is to be formed, increases the effect of the above problem on the profile accuracy of the Schottky electrode and thereby increases the effect on the performances of a semiconductor device as a completed product.

In the semiconductor device 100 of the embodiment, on the other hand, the angle θm between the side face 112s of the mesa portion 112m and the surface 112p of the semiconductor layer 112 is 90 degrees (as shown in FIG. 1). There is accordingly little possibility that the light L emitting downward for exposure enters from the side face 112s of the mesa portion 112m into the mesa portion 112m (as understood from FIG. 5). As a result, the non-exposed part Rse of the resist by the mask is substantially fully removed (as shown in FIG. 3). In manufacture of the semiconductor device 100 of the embodiment, the Schottky electrodes 150 of the high profile accuracy can thus be formed by the lift off method using the photoresist.

As a result, in the manufacturing method of the semiconductor device 100 of the embodiment, even when the small areas are set as the areas where the respective Schottky electrodes 150, 150 are to be formed, there is little possibility that the performances of the Schottky barrier diodes 100L and 100R are reduced due to reduction of the profile accuracy.

A4. Evaluation of Leak Current Density

A leak current density was measured under application of a reverse voltage with respect to a semiconductor device 100a of the embodiment including a plurality of Schottky barrier diodes and a semiconductor device 100c of a comparative example including one Schottky barrier diode. The semiconductor device 100a of the embodiment including the plurality of Schottky barrier diodes is configured to include twenty five Schottky barrier diodes having the same configuration as that of the Schottky barrier diodes 100L and 100R included in the semiconductor device 100 of the embodiment (shown in FIG. 1). In the semiconductor device 100a, the twenty five Schottky barrier diodes are arrayed in a line. The configuration of the semiconductor device 100a is similar to the configuration of the semiconductor device 100, except the different number of the Schottky barrier diodes.

Figure 6:
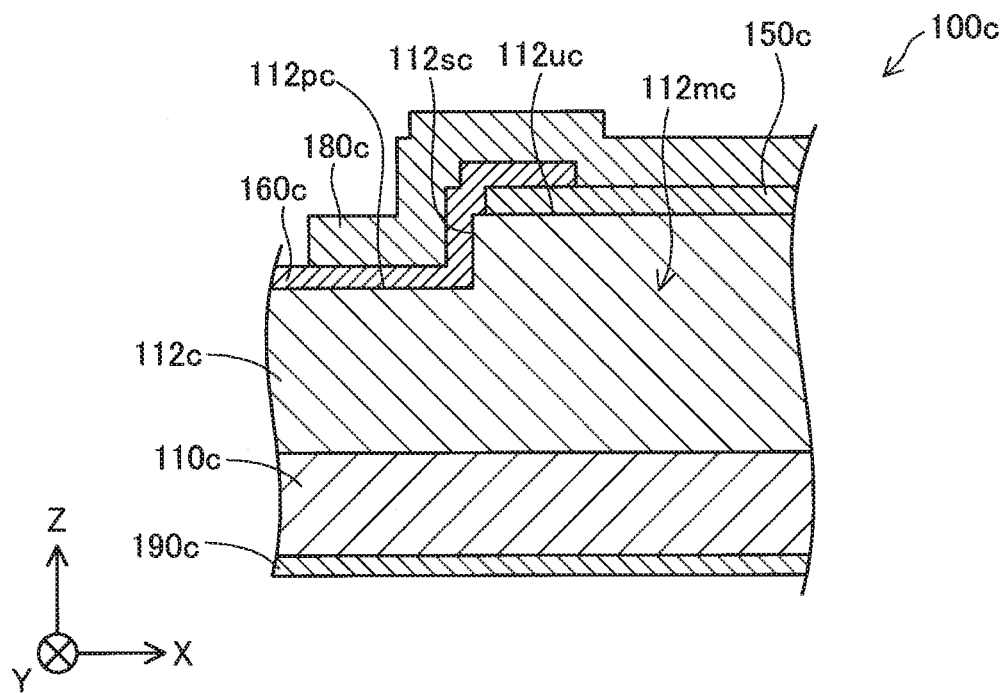
FIG. 6 is a sectional view schematically illustrating the configuration of a semiconductor device of a comparative example.

FIG. 6 is a sectional view schematically illustrating the configuration of the semiconductor device 100c of the comparative example. The semiconductor device 100c includes one Schottky barrier diode. A Schottky electrode 150c of the semiconductor device 100c has an area equal to the total area of twenty five Schottky electrodes of the semiconductor device 100a of the embodiment including the twenty five Schottky barrier diodes. The width of the Schottky electrode 150c of the comparative example is 25 times the width of the Schottky electrode of the semiconductor device 100a of the embodiment, and the depth of the Schottky electrode 150c of the comparative example is equal to the depth of the Schottky electrode of the semiconductor device 100a of the embodiment. The other configuration of the semiconductor device 100c of the comparative example is identical with that of the semiconductor device 100 of the embodiment. The respective components of the semiconductor device 100c shown in FIG. 6 are expressed by reference signs with addition of a suffix "c" to the reference signs provided to express the corresponding components of the semiconductor device 100.

FIG. 7 is a graph showing leak current densities under application of a reverse voltage with respect to samples A1 of the semiconductor device 100a of the embodiment and samples A2 of the semiconductor device 100c of the comparative example. The number of samples A1 and the number of samples A2 were both four.

The results of FIG. 7 show that all the samples A1 of the semiconductor device 100a of the embodiment have significantly lower leak current densities than the samples A2 of the semiconductor device 100c of the comparative example. The semiconductor device 100a of the embodiment has the significantly smaller width of one Schottky electrode (1/25) and the greater total number of ends of the Schottky electrodes and the greater total length of the ends of the Schottky electrodes with respect to the same total area, compared with the semiconductor device 100c of the comparative example. This configuration of the embodiment is expected to provide the greater effect per unit area of the Schottky electrode on suppression of the electric field crowding at the end of the Schottky electrode by the field plate structure.

The total area of the Schottky electrodes of the Schottky barrier diodes of the semiconductor device 100a is equal to the area of the Schottky electrode 150c of the Schottky barrier diode of the semiconductor device 100c as described above. The semiconductor device 100a and the semiconductor device 100c are thus expected to have equivalent levels of ON resistance. Accordingly the semiconductor device 100a of the embodiment significantly reduces the leak current under application of a reverse voltage, while maintaining the equivalent level of ON resistance to that of the configuration of the semiconductor device 100c including the Schottky electrode of the large area.

As described above, in the semiconductor device 100 or 100a of the embodiment including the plurality of Schottky barrier diodes, the side face 112s of the mesa portion 112m has the angle of not less than 85 degrees and not greater than 90 degrees (more specifically, the angle of 90 degrees) with respect to the surface 112p of the semiconductor layer 112. There is accordingly little possibility that light enters from the side face 112s of the mesa portion 112m into the semiconductor layer 112 to expose the resist on the upper face 112u of the mesa portion 112m (as understood from FIGS. 1 and 5) in the photolithography of process P150 to form the Schottky electrode 150 on the upper face 112u of the mesa portion 112m. The configuration of the embodiment reduces the dimensions of each mesa portion 112m such as to provide the sufficiently large effect of the field plate structure on the entire Schottky electrode 150 (as understood from FIG. 7), while providing the plurality of mesa portions 112m in the semiconductor layer 112 (as shown in FIG. 1). This configuration accordingly satisfies both suppression of the leakage current at the reverse bias and reduction of the ON resistance.

B. Modifications

B1. Modification 1

According to the embodiment described above, the substrate 110 is mainly made of gallium nitride (GaN). The substrate may, however, be made of another material, for example, silicon carbide (SiC), gallium arsenide (GaAs) or diamond (C).

According to the embodiment described above, the substrate 110 contains silicon (Si) as the donor element. The donor element included in the substrate as the n-type semiconductor layer is, however, not limited to silicon (Si) but may be, for example, germanium (Ge) or oxygen (O).

B2. Modification 2

According to the embodiment described above, the semiconductor layer 112 is mainly made of gallium nitride (GaN). The semiconductor layer forming the mesa portions may, however, be made of another semiconductor, for example, a semiconductor mainly made of silicon carbide (SiC), gallium arsenide (GaAs) or diamond (C). It is, however, preferable that the semiconductor layer forming the mesa portions is made of a semiconductor mainly made of gallium nitride (GaN) or a semiconductor mainly made of silicon carbide (SiC).

According to the embodiment described above, the semiconductor layer 112 contains silicon (Si) as the donor element. The donor element included in the n-type semiconductor layer is, however, not limited to silicon (Si) but may be, for example, germanium (Ge) or oxygen (O).

B3. Modification 3

According to the embodiment described above, the Schottky electrode 150 has the layered structure of the layer mainly made of nickel (Ni) and the layer mainly made of palladium (Pd). The Schottky electrode may, however, have another structure and may be, for example, an electrode mainly made of at least one of nickel (Ni), palladium (Pd), platinum (Pt) and iridium (Ir). It is preferable that the Schottky electrode is an electrode mainly made of at least one of nickel (Ni), palladium (Pd) and platinum (Pt).

B4. Modification 4

According to the embodiment described above, the insulating film 160 has the layered structure of the layer mainly made of aluminum oxide ($Al_2O_3$) and the layer of mainly made of silicon dioxide ($SiO_2$). The insulating film may, however, have another structure. For example, the insulating film may be formed from a material that is mainly made of at least one of silicon dioxide ($SiO_2$), aluminum oxide ($Al_2O_3$), silicon nitrides (SiNx), silicon oxynitride (SiON), zirconium oxynitride (ZrON), aluminum oxynitride (AlON) and zirconium oxide ($ZrO_2$). It is preferable that the insulating film includes a layer formed from a material mainly made of at least one of silicon dioxide ($SiO_2$), aluminum oxide ($Al_2O_3$) and silicon nitrides (SiNx).

B5. Modification 5

According to the embodiment described above, the wiring electrode 180 has the layered structure of the layer mainly made of titanium nitride (TiN) and the layer mainly made of an aluminum silicon alloy (AlSi), which are arranged sequentially from the Schottky electrode 150- and the insulating film 160-side. The wiring electrode may, however, have another structure, for example, a multi-layered structure by combination of another material such as copper (Cu) or gold (Au) or a single-layered structure. The wiring electrode may include a layer formed by combining another material such as tungsten (W), vanadium (V), tantalum (Ta) or molybdenum (Mo) as the barrier metal.

B6. Modification 6

According to the embodiment described above, the layer of silicon dioxide is used as the etching mask to form the mesa portions 112m of the semiconductor layer 112 by dry etching (P120 in FIG. 2). The etching mask used to form the mesa portions of the semiconductor layer may be a photoresist. Wet etching using, for example, an alkaline etching solution may be performed after dry etching to form the mesa portions. This modified procedure enables a damaged layer to be removed from the mesa portion or the surface of another part of the semiconductor layer. As a result, this more effectively reduces the leak current in the semiconductor device.

B7. Modification 7

According to the embodiment described above, the Schottky electrodes 150 are formed on the upper faces 112u of the mesa portions 112m of the semiconductor layer 112 by electron beam vapor deposition (P150 in FIG. 2). The technique employed to form the Schottky electrodes is, however, not limited to electron beam vapor deposition but may be, for example, resistance heating vapor deposition or sputtering.

According to the embodiment described above, the Schottky electrodes 150 are formed on the upper faces 112u of the mesa portions 112m of the semiconductor layer 112 by the lift off method (P150 in FIG. 2). The Schottky electrodes may, however, be formed on the upper faces of the mesa portions of the semiconductor layer by forming an electrode on the entire surface of the semiconductor layer, subsequently forming a mask pattern using a photoresist on the electrode and removing parts of the electrode by a technique such as etching or ion milling.

B8. Modification 8

According to the embodiment described above, the Schottky electrode 150 is formed on the upper face 112u of the mesa portion 112m by photolithography. The procedure of setting the angle θm (shown in FIG. 1) to be not less than 85 degrees and not greater than 90 degrees enables any structure other than the Schottky electrode to be formed with high accuracy on the upper face of the mesa portion by photolithography.

B9. Modification 9

According to the embodiment described above, the openings 168 are formed in the insulating film 160 by removing parts of the insulating film 160 by fluoric acid-based wet etching (P168 in FIG. 2). The technique employed for no formation of the insulating film on part of the Schottky electrode (as shown in FIG. 1) may be, for example, dry etching by reactive ion etching (RIE) or a combination of wet etching and dry etching.

B10. Modification 10

According to the embodiment described above, the process of forming the cathode electrode 190 (process P190) is performed after the other processes P110 to P180 (shown in FIG. 2). The process of forming the cathode electrode 190 may, however, be performed prior to any of these processes P110 to P180.

B11. Modification 11

According to the embodiment described above, the semiconductor device 100 has the predetermined profile with respect to the predetermined distance in the Y-axis direction. More specifically, for example, the edge 112ue of the upper face 112u of the mesa portion 112m, the end 150e of the Schottky electrode 150 and the edge 168e of the opening 168 (shown in FIG. 1) are extended parallel to the Y-axis direction. The shape of any of the upper face of the mesa portion, the Schottky electrode, and the opening in projection in the Z-axis direction is, however, not necessarily limited to the rectangular shape or square shape but may be any shape for example, a circular shape or a triangular shape. When the shape of any of the upper face of the mesa portion, the Schottky electrode, and the opening in projection in the Z-axis direction is a circular shape, the "reference cross section" is a cross section passing through the center of a circle on the upper face of the mesa portion.

B12. Modification 12

The above embodiment describes the semiconductor device 100 including the two vertical Schottky barrier diodes 100L and 100R. The present disclosure may, however, be applied to another configuration, such as a lateral Schottky barrier diode. The present disclosure may also be applied to a PN diode including an ohmic electrode. The number of the Schottky barrier diodes as the semiconductor units included in the semiconductor device is not limited to two or twenty five but may be another number, for example, three or more, four or more, or twenty, thirty, forty or more. The semiconductor device to which the present disclosure is applied is not limited to the semiconductor device described in the above embodiment but may be any semiconductor device including Schottky electrodes.

B13. Modification 13

According to the embodiment described above, each of the Schottky barrier diodes 100L and 100R as the semiconductor unit is configured to include the insulating film 160 and the wiring electrode 180 provided on the respective sides of the Schottky electrode 150 (or more specifically, the respective sides of the portion 151 of the Schottky electrode 150). According to a modification, part of the plurality of semiconductor units included in the semiconductor device may be configured to include the insulating film 160 and the wiring electrode 180 provided only on one side of the Schottky electrode. This modified configuration still satisfies both suppression of the leakage current at the reverse bias and reduction of the ON resistance with respect to the overall semiconductor device including the plurality of semiconductor units.

A preferable configuration includes the insulating film and the wiring electrode provided in a location surrounding the Schottky electrode. The "location surrounding the Schottky electrode" may be a location surrounding three out of four sides, i.e., front, rear, left and right sides, of the Schottky electrode or may be a location surrounding the entire circumference of the Schottky electrode. This configuration effectively has the effect of reducing the electric field crowding at the end of the Schottky contact on the entire Schottky electrode.

B14. Other Modifications

The disclosure is not limited to any of the embodiment, the examples, and the modifications described above but may be implemented by a diversity of other configurations without departing from the scope of the disclosure. For example, the technical features of any of the embodiment, the examples and the modifications may be replaced or combined appropriately, in order to solve part or all of the problems described above or in order to achieve part or all of the advantageous effects described above. Any of the technical features may be omitted appropriately unless the technical feature is described as essential herein. The present disclosure may be implemented by aspects described below.

(1) According to one aspect of the disclosure, there is provided a semiconductor device including a plurality of semiconductor units formed in a semiconductor layer. Each of the semiconductor units comprising:

a mesa portion protruded upward in the semiconductor layer and configured to include an upper face and a side face; a Schottky electrode configured to form a Schottky contact with the semiconductor layer on the upper face of the mesa portion; an insulating film formed continuously on another portion of the Schottky electrode that is nearer to an edge of the upper face than one portion of the Schottky electrode on the upper face of the mesa portion, on the side face of the mesa portion, and on a surface of the semiconductor layer other than the mesa portion; and a wiring electrode formed on the Schottky electrode and the insulating film. An angle between the side face of the mesa portion and the surface of the semiconductor layer is not less than 85 degrees and not greater than 90 degrees. Apart of the wiring electrode is placed between the insulating films formed on opposed side faces of adjacent mesa portions.

In the semiconductor device of this aspect, the side face of the mesa portion has an angle of not less than 85 degrees and not greater than 90 degrees with respect to the surface of the semiconductor layer. In a photolithography process to form the structure including the Schottky electrode on the upper face of the mesa portion, there is accordingly little possibility that light emitting downward enters from the side face of the mesa portion into the semiconductor layer to expose a resist on the upper face of the mesa portion. Even when the mesa portion is set to have a small width, this configuration enables the structure on the upper face of the mesa portion to be formed with high accuracy. The configuration of this aspect reduces the dimensions of each mesa portion such as to provide the sufficiently large effect of the field plate structure on the entire Schottky electrode, while providing the plurality of semiconductor units including the mesa portions in the semiconductor layer. This configuration accordingly satisfies both suppression of leakage current at the reverse bias and reduction of ON resistance.

The insulating film may not be formed on the one portion of the Schottky electrode on the upper face of the mesa portion. The wiring electrode may be formed continuously on the one portion of the Schottky electrode, on a portion of the insulating film formed on the another portion of the Schottky electrode, on a portion of the insulating film formed on the side face of the mesa portion, and part of a portion of the insulating film formed on the surface of the semiconductor layer. The insulating films formed on the opposed side faces may be interconnected on the surface of the semiconductor layer, such as to separate the part of the wiring electrode from the semiconductor layer.

(2) In the semiconductor device of the above aspect, a width of the mesa portion may be not less than 2.0 μm and not greater than 15.0 μm. In the semiconductor device of this aspect, the width of the mesa portion is not greater than 15.0 μm. This configuration enables the effect of the filed plate structure to be provided not only on an end of the Schottky electrode but on the entire Schottky electrode, compared with a configuration that the width of the mesa portion is greater than 15.0 μm. In the semiconductor device of this aspect, the width of the mesa portion is also not less than 2.0 μm. This configuration enables the mesa portion to be more readily formed, compared with a configuration that the width of the mesa portion is less than 2.0 μm.

(3) In the semiconductor device of the above aspect, a distance between the adjacent mesa portions may be not less than 1.0 μm and be not greater than a width of the mesa portion. In the semiconductor device of this aspect, the distance between the adjacent mesa portions is not greater than the width of the mesa portion. This configuration increases the number of semiconductor units arranged per unit area, compared with a configuration that the distance between the adjacent mesa portions is greater than the width of the mesa portion. In the semiconductor device of this aspect, the distance between the adjacent mesa portions is also not less than 1.0 μm. This configuration enables the wiring electrode to be readily provided on the insulating film between the adjacent mesa portions, compared with a configuration that the distance between the adjacent mesa portions is less than 1.0 μm.

(4) In the semiconductor device of the above aspect, a height of the mesa portion may be not less than 0.1 μm and not greater than 5.0 μm. In the semiconductor device of this aspect, the height of the mesa portion is not less than 0.1 μm. This configuration more effectively reduces the field intensity of the Schottky contact between the semiconductor layer and the Schottky electrode, compared with a configuration that the height of the mesa portion is less than 0.1 μm. In the semiconductor device of this aspect, the height of the mesa portion is also not greater than 5.0 μm. This configuration facilitates processing of the mesa portion, compared with a configuration that the height of the mesa portion is greater than 5.0 μm.

(5) In the semiconductor device of the above aspect, the Schottky electrode may be configured such that a distance between an end of the Schottky electrode and an edge of the upper face of the mesa portion is not greater than 2.0 μm on the upper face of the mesa portion. This configuration more effectively reduces the field intensity of the Schottky contact between the semiconductor layer and the Schottky electrode, compared with a configuration that the distance between the end of the Schottky electrode and the edge of the upper face of the mesa portion is greater than 2.0 μm.

(6) In the semiconductor device of the above aspect, a thickness of the insulating film is not less than 50 nm and is less than half a distance between the adjacent mesa portions. In the semiconductor device of this aspect, the thickness of the insulating film is less than half the smallest distance among the distances between adjacent mesa portions among the plurality of mesa portions. This configuration increases the number of semiconductor units arranged per unit area, compared with a configuration that the thickness of the insulating film is not less than half the smallest distance among the distances between adjacent mesa portions among the plurality of mesa portions. In the semiconductor device of this aspect, the wiring electrode is readily provided on the insulating film between the adjacent mesa portions, compared with the configuration that the thickness of the insulating film is not less than half the smallest distance between adjacent mesa portion. In the semiconductor device of this aspect, the thickness of the insulating film is also not less than 50 nm. This configuration reduces the possibility of breakdown in the insulating film, compared with a configuration that the thickness of the insulating film is less than 50 nm.

(7) In the semiconductor device of the above aspect, the insulating film and the wiring electrode are provided on respective sides of the one portion of the Schottky electrode in each of the semiconductor units. This configuration reduces the field intensity of the Schottky contact on the respective sides of the Schottky electrode.

(8) In the semiconductor device of the above aspect, the insulating film and the wiring electrode are provided in a location surrounding the one portion of the Schottky electrode in each of the semiconductor units. This configuration reduces the field intensity of the Schottky contact in the periphery of the Schottky electrode.

(9) According to another aspect of the disclosure, there is provided a manufacturing method of a semiconductor device including a plurality of semiconductor units formed in a semiconductor layer. The manufacturing method comprises: (a) forming a plurality of mesa portions in the semiconductor layer, such that each of the mesa portions is protruded upward in the semiconductor layer and includes an upper face and a side face; (b) forming a Schottky electrode with respect to each of the plurality of mesa portions by photolithography, such that the Schottky electrode forms a Schottky contact with the semiconductor layer on the upper face of the mesa portion; (c) forming an insulating film with respect to each of the plurality of mesa portions, such that the insulating film is formed continuously on another portion of the Schottky electrode that is nearer to an edge of the upper face than one portion of the Schottky electrode on the upper face of the mesa portion, on the side face of the mesa portion, and on a surface of the semiconductor layer other than the mesa portion; and (d) forming a wiring electrode with respect to each of the plurality of mesa portions, such that the wiring electrode is formed on the Schottky electrode and the insulating film. Forming the mesa portions comprises forming each of the mesa portions such that an angle between the side face of the mesa portion and the surface of the semiconductor layer is not less than 85 degrees and not greater than 90 degrees. Forming the insulating film comprises forming the insulating film such that the insulating films formed on opposed side faces of adjacent mesa portions is interconnected on the surface of the semiconductor layer. Forming the wiring electrode comprises placing a part of the wiring electrode between the insulating films formed on the opposed side faces.

In the manufacturing method of the semiconductor device of this aspect, the side face of the mesa portion has an angle of not less than 85 degrees and not greater than 90 degrees with respect to the surface of the semiconductor layer. In a photolithography process to form the structure including the Schottky electrode on the upper face of the mesa portion, there is accordingly little possibility that light emitting downward enters from the side face of the mesa portion into the semiconductor layer to expose a resist on the upper face of the mesa portion. Even when the mesa portion is set to have a small width, this configuration enables the structure on the upper face of the mesa portion to be formed with high accuracy. The manufacturing method of this aspect reduces the dimensions of each mesa portion such as to provide the sufficiently large effect of the field plate structure on the entire Schottky electrode, while providing the plurality of semiconductor units including the mesa portions in the semiconductor layer. This configuration accordingly manufactures the semiconductor device that satisfies both suppression of leakage current at the reverse bias and reduction of ON resistance.

In the above process (c), the insulating film may not be formed on the one portion of the Schottky electrode on the upper face of the mesa portion. In the above process (d), the wiring electrode may be formed continuously on the one portion of the Schottky electrode, on a portion of the insulating film formed on the another portion of the Schottky electrode, on a portion of the insulating film formed on the side face of the mesa portion, and part of a portion of the insulating film formed on the surface of the semiconductor layer. The forming the wiring electrode may include forming the part of the wiring electrode on the insulating films interconnected on the semiconductor layer.

The disclosure may be implemented by any of various aspects other than the semiconductor device and the manufacturing method of the semiconductor device described above, for example, a Schottky barrier diode unit, a semiconductor unit, an electric equipment in which any of these units and the semiconductor device of any of the above aspects is incorporated, a manufacturing apparatus for manufacturing the semiconductor device, a method of designing any of these units, equipment and apparatus, and a method of manufacturing any of these units, equipment and apparatus.

What is claimed is:

1. A semiconductor device including a plurality of semiconductor units formed in a semiconductor layer,
    each of the semiconductor units comprising:
        a mesa portion protruded upward in the semiconductor layer and configured to include an upper face and a side face;
        a Schottky electrode configured to form a Schottky contact with the semiconductor layer on the upper face of the mesa portion;
        an insulating film formed continuously on another portion of the Schottky electrode that is nearer to an edge of the upper face than one portion of the Schottky electrode on the upper face of the mesa portion, on the side face of the mesa portion, and on a surface of the semiconductor layer other than the mesa portion; and
        a wiring electrode formed on the Schottky electrode and the insulating film, wherein
    an angle between the side face of the mesa portion and the surface of the semiconductor layer is not less than 85 degrees and not greater than 90 degrees, and
    a part of the wiring electrode is placed between the insulating films formed on opposed side faces of adjacent mesa portions.

2. The semiconductor device according to claim 1, wherein a width of the mesa portion is not less than 2.0 μm and not greater than 15.0 μm.

3. The semiconductor device according to claim 1, wherein a distance between the adjacent mesa portions is not less than 1.0 μm and is not greater than a width of the mesa portion.

4. The semiconductor device according to claim 1, wherein a height of the mesa portion is not less than 0.1 μm and not greater than 5.0 μm.

5. The semiconductor device according to claim 1, wherein the Schottky electrode is configured such that a distance between an end of the Schottky electrode and an edge of the upper face of the mesa portion is not greater than 2.0 μm on the upper face of the mesa portion.

6. The semiconductor device according to claim 1, wherein a thickness of the insulating film is not less than 50 nm and is less than half a distance between the adjacent mesa portions.

7. The semiconductor device according to claim 1, wherein the insulating film and the wiring electrode are provided on respective sides of the one portion of the Schottky electrode in each of the semiconductor units.

8. The semiconductor device according to claim 1, wherein the insulating film and the wiring electrode are provided in a location surrounding the one portion of the Schottky electrode in each of the semiconductor units.

9. A manufacturing method of a semiconductor device including a plurality of semiconductor units formed in a semiconductor layer, comprising:
    (a) forming a plurality of mesa portions in the semiconductor layer, such that each of the mesa portions is protruded upward in the semiconductor layer and includes an upper face and a side face;
    (b) forming a Schottky electrode with respect to each of the plurality of mesa portions by photolithography, such that the Schottky electrode forms a Schottky contact with the semiconductor layer on the upper face of the mesa portion;
    (c) forming an insulating film with respect to each of the plurality of mesa portions, such that the insulating film is formed continuously on another portion of the Schottky electrode that is nearer to an edge of the upper face than one portion of the Schottky electrode on the upper face of the mesa portion, on the side face of the mesa portion, and on a surface of the semiconductor layer other than the mesa portion; and
    (d) forming a wiring electrode with respect to each of the plurality of mesa portions, such that the wiring electrode is formed on the Schottky electrode and the insulating film, wherein
    forming the mesa portions comprises forming each of the mesa portions such that an angle between the side face of the mesa portion and the surface of the semiconductor layer is not less than 85 and not greater than 90 degrees,
    forming the insulating film comprises forming the insulating film such that the insulating films formed on opposed side faces of adjacent mesa portions is interconnected on the surface of the semiconductor layer, and
    forming the wiring electrode comprises placing a part of the wiring electrode between the insulating films formed on the opposed side faces.

* * * * *